United States Patent [19]

DeMambro et al.

[11] 4,156,861

[45] May 29, 1979

[54] WAVEGUIDE DIODE MOUNT

[75] Inventors: John A. DeMambro, Wellesley; Carl G. Dahl, Hopkinton; Robert S. Donaldson, Bedford, all of Mass.

[73] Assignee: Raytheon Company, Lexington, Mass.

[21] Appl. No.: 812,286

[22] Filed: Jul. 1, 1977

[51] Int. Cl.² ........................ H01P 1/00; H01P 5/10; H03C 7/02
[52] U.S. Cl. ............................... 333/250; 307/317 R; 329/161; 333/245
[58] Field of Search ................... 333/98 R, 98 S, 7 D, 333/7 R, 83 R, 97 R; 330/4.6, 4.9, 56; 331/107 G, 96, 101, 107 R, 97

[56] References Cited

U.S. PATENT DOCUMENTS

| | | | |
|---|---|---|---|
| 2,555,151 | 5/1951 | Noyes, Jr. | 333/98 X |
| 2,781,500 | 2/1957 | Armstrong | 333/98 X |
| 3,050,689 | 8/1962 | De Loach, Jr. | 330/56 X |
| 3,878,480 | 4/1975 | Hulderman et al. | 331/106 G X |
| 4,063,186 | 12/1977 | Rubin | 333/98 R X |

*Primary Examiner*—Alfred E. Smith
*Assistant Examiner*—Marvin Nussbaum
*Attorney, Agent, or Firm*—Milton D. Bartlett; Joseph D. Pannone

[57] ABSTRACT

A microwave-type device such as a mixer is disclosed having an improved diode mount with the position of the diode within the waveguide determined solely by the position of a contact rod extending into the waveguide on the side of the waveguide opposite the ground contact of the diode. The contact rod mates with the active contact of the diode by an annular spring fashioned at the waveguide end of the rod. The annular spring also provides a stop against which the diode rests thus determining its position. Electrical connection to the ground contact is made through a second annular spring. A coil spring provides longitudinal force holding the diode in position against the contact rod.

12 Claims, 2 Drawing Figures

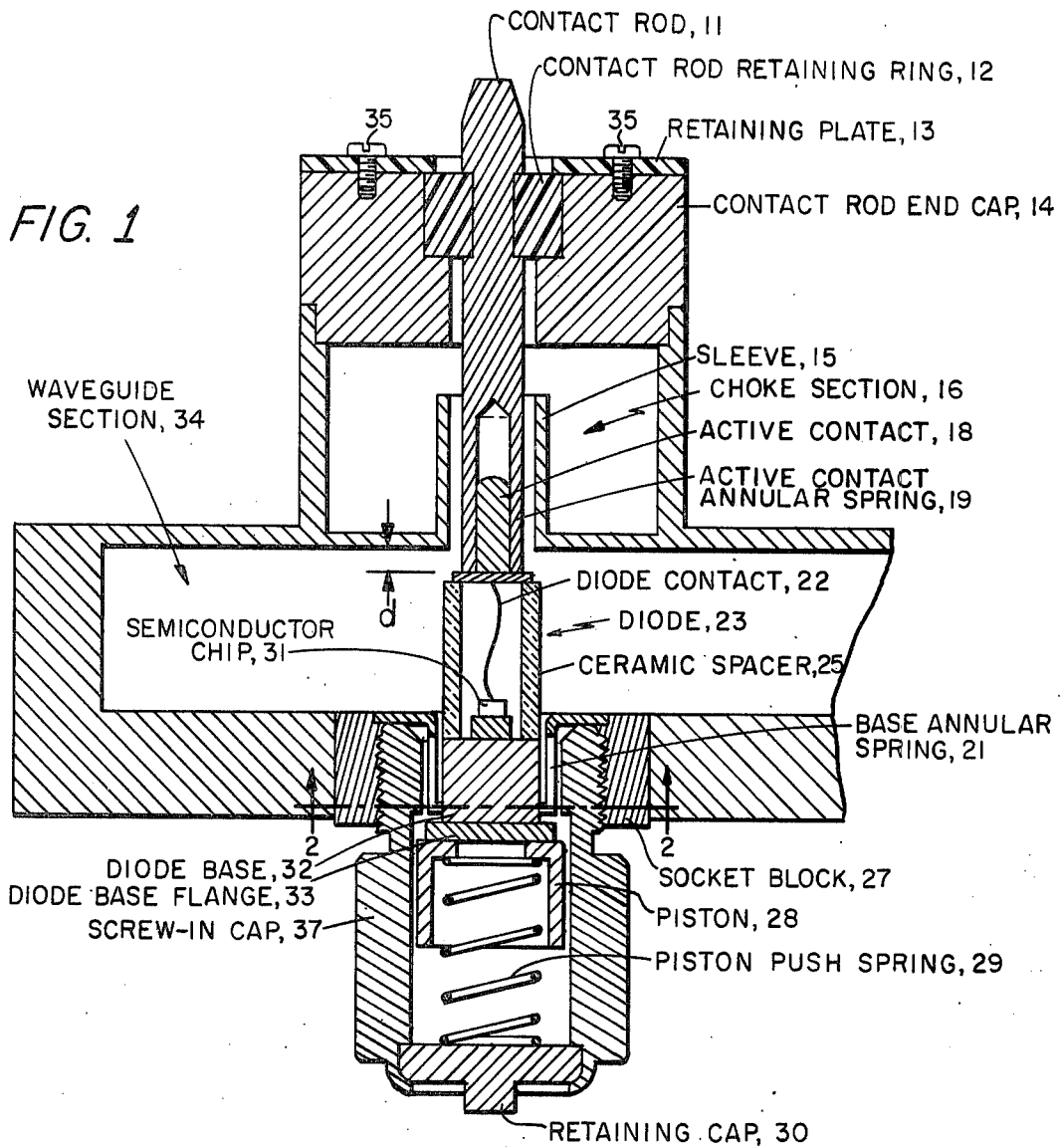
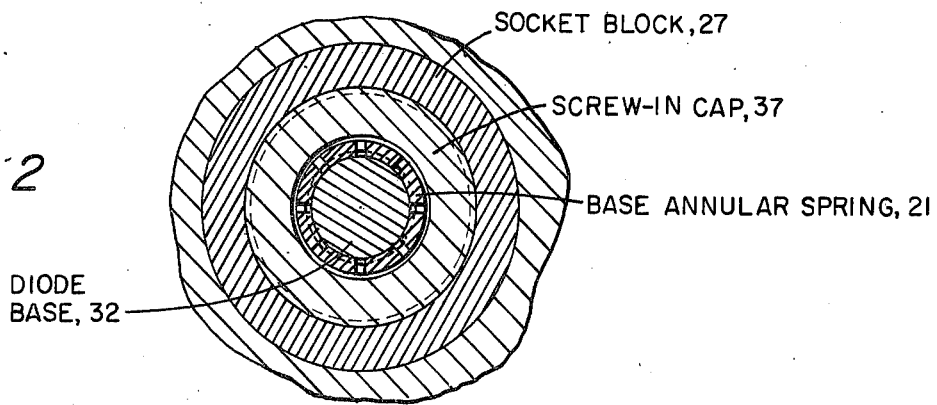

WAVEGUIDE DIODE MOUNT

The invention described herein was made in the course of or under a contract or subcontract thereunder, with the Department of Defense.

BACKGROUND OF THE INVENTION

1. Field of the Invention

The invention pertains to waveguide assemblies such as may be used for mixers, detectors, or other such applications. More particularly, the invention concerns diode mounts for use in such waveguide assemblies.

2. Description of the Prior Art

The provision of a reliable diode mount in waveguide assemblies for cartridge type diodes and the like has long been a problem. Such diodes are generally constructed with an insulating cylindrical center portion and contacts on either end thereof. The active contact is also generally cylindrical but with a smaller diameter than the central body portion. The ground contact, however, was cylindrical but of a larger diameter than the central body portion and also having a further flange at the end of the base portion of the ground contact having still a greater diameter. Previous waveguide assemblies had mounts in which the diode was positioned and held in place by providing an aperture having a lip against which the flange could rest with a screw cap holding the flange against the lip. Connection to the active contact of the diode was provided through a contact rod or pin extending through an aperture in the opposite side of the waveguide. The position of the diode within the waveguide was determined entirely by the position of the lip against which the diode flange was secured. Unfortunately, as the aperture around the lip was necessarily of greater diameter than the base portion of the diode, there was an unavoidably large tolerance upon the lateral position of the diode within the mount.

In many applications, the longitudinal position of the diode as determined by the distance between the juncture of the active contact and central diode body and the wall of the waveguide adjacent the active contact is of critical importance in determining the effective inductance of the connections to the diode and the amount of coupling between waves in the waveguide and the diode. Because of manufacturing tolerances of both the diode base and central portion as well as tolerances on the distance between the lip holding the diode flange and the adjacent wall of the waveguide, the actual coupling in any one device was subject to wide variation. Moreover, because of the positioning problem in both lateral and longitudinal directions, additional resistance was introduced into both active and ground or base connections with the diode. Resistive losses, noise and RF leakage resulted.

SUMMARY OF THE INVENTION

Accordingly, it is an object of the present invention to provide a microwave assembly having a diode mount in which the position of the diode within the mount and assembly is substantially independent of manufacturing tolerances.

Moreover, it is an object of the present invention to provide such an assembly and mount having contacts which provide a low resistance to the diode independent of manufacturing tolerances.

It is still further an object of the present invention to provide such an assembly and mount in which contact to a diode is made completely around both active and base contacts of the diode, thereby preventing RF leakage.

These, as well as other objects of the invention, may be met by providing the combination of means for guiding electromagnetic waves and means for operatively mounting a device package, which may be one of the above-described diode devices or any other device package which it is desired to mount within the waveguide at a position determined by contacting means which is positioned at least partially within an active portion of the waveguiding means. The active portion of the waveguiding means is the inner section in which the electromagnetic waves are confined. The waveguiding means may be square, rectangular, circular or any other desired shape having one or more conductive surfaces. A first contact of the device package is in electrical contact with the contracting means while a second contact is an electrical contact with at least one of the conductive surfaces of the waveguiding means. The longitudinal position of the device package is preferably determined only by the position of the contacting means while the lateral position of the device package is determined jointly by the positions of the contacting means and means for forming electrical contact between the conductive surface of the waveguiding means and the second electrical contact of the device package.

The invention may further be practiced by providing the combination of a waveguide section and means for operatively mounting a device package at least partially within an active portion of the waveguide section wherein the device package has a generally cylindrical central body portion, a generally cylindrical electrically conductive base portion at one end of the body portion, and a generally cylindrical electrically conductive end contact at the other end of the body portion wherein the mounting means has means for providing electrical connection to the end contact and in which the longitudinal position of the device package within the waveguide section is determined only by the position of the means for providing electrical connection to the end contact. Means is also provided for providing electrical connection to the base portion such as first spring means which provides inwardly directed radial pressure upon the base portion. The diameter of the end contact is preferably less than the diameter of the body portion. The means for providing electrical connection to the end contact preferably includes a second spring means which provides inwardly directed radial pressure upon the end contact. The longitudinal position of the device package within the waveguide is determined solely by the position of the second spring means.

Objects of the invention may also be practiced by a microwave assembly including a mount for a mixer or detector diode or the like, which includes the combination of a section of the waveguide having at least one conductive wall for providing confinement of electromagnetic waves, a first annular spring contact which is positioned within a first aperture of the waveguide and which is adapted for applying inwardly directed radial pressure to a first contact of a package device adapted for use in the mount, the position of the application of the pressure being outside the region in which the electromagnetic waves are confined, and a second annular spring contact which is positioned within a second aperture of the waveguide and which applies inwardly directed radial pressure to a second contact of the package device with the second annular spring contact having at least portions within the regions in which the electromagnetic waves are confined, the longitudinal position of the device package being determined only by the position of the second annular spring contact. Preferably, the package device which is adapted for use in the microwave assembly has a substantially cylindrical body portion with first and second substantially cylindrical contacts provided at either end of the body portion which are aligned axially with one another and with the body portion. The second contact is of lesser diameter than the body portion with the juncture between the second contact and the body portion. In a preferred embodiment, the first annular spring contact is an electrical contact with at least one conductive wall of the waveguide. A third spring, such as a coil spring may also be provided for providing a longitudinal force upon the device package in the direction of the second annular contact for holding the device package in position with the second contact held against the second annular spring contact.

The invention may still further be practiced by a microwave assembly which includes a mount for a diode or other similar device within a section of waveguide which includes the combination of a section of waveguide having four conductive walls forming a substantially rectangular cross section for confining electromagnetic waves therein, a contact rod, one end of which extends partially through a first aperture in a first one of the conductive walls of the waveguide with that end of the contact rod having a hollow center portion and also being fashioned to form a first annular spring, a second annular spring positioned in a second aperture which is located in the conductive wall of the waveguide opposite the conductive wall in which the first aperture is located with the second annular spring being adapted for applying inwardly directed radial pressure upon the diode or other device positioned within the mount, the region of application of the pressure being outside the active area of the device in which the electromagnetic waves are confined, the second annular spring being formed of a conductive material, and the second annular spring being an electrical contact with the conductive wall in which the second aperture is located, a spring for applying longitudinal force to the device in the direction of the contact rod with that spring being positioned adjacent the second annular spring on the side of second annular spring opposite the contact rod, and an end cap for enclosing the spring for applying the longitudinal force with the end cap being removably coupled to the same conductive wall of the waveguide in which the second aperture is located. There may further be provided a waveguide choke section positioned adjacent the first aperture in the wave guide with the contact rod extending at least partially through portions of the choke section. The end cap preferably has a screw thread on one end thereof. There is also provided a socket block coupled to the wave guide which is adapted for operatively receiving the theaded end of the end cap.

BRIEF DESCRIPTION OF DRAWINGS

FIG. 1 is a cross-sectional view of a microwave assembly incorporating a diode mount in accordance with the present invention; and FIG. 2 is a cross-sectional view taken through a portion of the assembly shown in FIG. 1.

DESCRIPTION OF THE PREFERRED EMBODIMENT

Referring first to FIG. 1, there is shown therein a microwave assembly such as a mixer or detector in which the present invention is used to advantage. Diodes or other devices adapted for use with the invention have generally the same outside shape as diode 23. The central portion of the device package is a cylindrical ceramic spacer 25 which has a hollow interior in which a passive or active device such as semiconductor chip 31 may be operatively mounted. A diode contact 22 connects semiconductor chip 31 or other device to active contact 18 affixed to one end of ceramic spacer 25. Active contact 18 is also of generally cylindrical shape in axial alignment with ceramic spacer 25 but of lesser outside diameter. A flanged conductive portion may be used for connecting active contact 18 to ceramic spacer 25. The other end of ceramic spacer 25 is affixed to conductive diode base 32. Diode base 32 is again cylindrical having a diameter which is nearly the same or, in some embodiments, slightly larger than the diameter of ceramic spacer 25. Diode base 32 is preferably of solid construction to conduct heat away from semiconductor chip 31 during active device operation. Diode base flange 33, of circular shape, is electrically and mechanically coupled to the side of diode base 32 opposite ceramic spacer 25. This type of diode or package device construction is what is termed in the art of the "cartridge" type package.

Diode 23 is operatively mounted and positioned within waveguide section 34 with an improved mounting technique which provides both accurate positioning and low loss. Contact rod 11 extends through sleeve 15 in the upper conductive wall of waveguide section 34. Contact rod 11 is held in place by insulating contact rod retaining ring 12 which fits within a groove in the upper portion of contact rod 11. Contact rod retaining ring 12 is in turn secured within contact rod end cap 14 by insulating retaining plate 13 attached by screws 35. Contact rod end cap 14 is electrically coupled to and supported by the conductor walls of choke section 16. The conductive walls of choke section 16 are fashioned with dimensions so as to form a cavity which acts as a choke for electromagnetic waves coupled into the cavity by contact rod 11 from the interior or active portion of waveguide section 34 to prevent such waves from further propagating outward along contact rod 11. A DC bias voltage or low frequency modulating signal or other signal as required by a particular application is coupled to contact rod 11 for transmission to the diode or other device as required.

The lower portion of contact rod 11 extends through sleeve 15 into the active portion of waveguide section 34. The lower portion of contact rod 11 is fashioned into an active contact annular spring 19 for mating with and providing electrical contact to active contact 18 of diode 23. To fashion such an annular spring, the inner portion of the lower end of contact rod 11 is first drilled out then longitudinal cuts made in the remaining metal along the length of the drilled out portion. As shown in the view of FIG. 1, active contact annular spring 19 provides electrical contact with an inwardly directed radial or compressional force along nearly the entire length of active contact 18.

When operatively placed in position within the diode mount, the lower end of contact rod 11 abuts against the juncture between the elongated and flanged portion of active contact 18 thereby determining the longitudinal position of diode 23 within waveguide section 34. Because of the construction shown, the distance d between the upper portion of the flanged portion of active contact 18 and the conductive wall of waveguide section 34, which is the critical dimension in determining the amount of coupling between waves in wave guide section 34 and diode 23, is accurately determined by the distance contact rod 11 extends within the active portion of waveguide section 34. In previous diode mount constructions in which the diode was held in place within the waveguide section by the diode base flange, the longitudinal position of the diode within the waveguide section was subject to the manufacturing tolerances of the ceramic spacer, the diode base, diode base flange and the mount itself. In contrast with the present invention, the longitudinal position of the diode may be accurately determined simply by the position of the contact rod 11 within the waveguide section 34.

Electrical and mechanical contact to diode base 32 is made through base annular spring 21. Base annular spring 21 is fashioned having a flanged portion raised to socket block 27 with cylindrical side-wall portions and lower contact fingers which make the actual contact with diode base 32. The juncture between the contact fingers of base annular spring 21 and diode base 32 is shown in a cross-sectional view of FIG. 2. Base annular spring 21 provides inwardly directed radial pressure around the entire circumference of diode base 32 at the point of contact. Because the point of contact is continuous RF leakage around diode base 32 is prevented. Beryllium-copper coated with gold is the preferred material for base annular spring 21 while brass may be used for socket block 27. The height of base annular spring 21 is chosen such that the contact fingers of base annular spring 21 will not touch base diode flange 33 over the expected range of diode manufacturing tolerances.

Diode 23 is held in place longitudinally by a longitudinal force exerted upon diode base flange 33 through piston 28 by piston push spring 29. The lower end of piston push spring 29 pushes against retaining cap 30 at the lower end of screw-in cap 37. Threads are provided within socket block 27 for receiving the threads of screw-in cap 37.

As may be readily appreciated, the lateral position of diode 23 within waveguide section 34 is determined jointly by active contact annular spring 19 and base annular spring 21. Because of the joint spring action, it is insured that good contact will be provided at all times to both base and active contacts.

This completes the description of the preferred embodiment of the invention. Although a preferred embodiment has been described, it is believed that numerous modifications and alterations thereto would be apparent to one having ordinary skill in the art without departing from the spirit and scope of the invention.

What is claimed is:

1. In combination:
a waveguide section;
means for operatively mounting a diode package at least partially within an active portion of said waveguide section, said device package having a generally cylindrical body portion, a generally cylindrical electrically conductive base portion at one end of said body portion, and a generally cylindrical electrically conductive end contact at the other end of said body portion, said mounting means having a contact rod for providing electrical connection to said end contact, said contact rod being generally coaxial with said device package, the position of said device package within said waveguide section with respect to the longitudinal axis of said device package being determined only by the longitudinal position of said contact rod; and
means for providing an electrical connection to said base portion, said means for providing electrical connection to said base portion comprising: first spring means, said first spring means providing inwardly directed radial pressure upon said base portion.

2. The combination of claim 1 wherein:
the diameter of said end contact is less than the diameter of said body portion; and
wherein said contact rod comprises:
second spring means at the end of said rod to which connection is made to said end contact, said second spring means providing inwardly directed radial pressure upon said end contact.

3. The combination of claim 2 wherein said package device comprises:
a semiconductor device.

4. The combination of claim 3 wherein said semiconductor device comprises:
a diode device.

5. A microwave assembly including a mount for a mixer of detector diode or the like comprising in conbination:
a section wave guide having at least one conductive wall for providing confinement of electromagnetic waves;
a first annular spring contact, said first annular spring contact being positioned within a first aperture in said waveguide, said first annular spring contact applying inwardly directed radial pressure to a first contact of a device package, adapted for use in said mount, the position of application of said pressure being outside the region in which said electromagnetic waves are confined;
a contact rod having at one end thereof a second annular spring contact, said second annular spring contact being positioned within a second aperture in said waveguide, said second annular spring contact applying inwardly directed radial pressure to a second contact of said device package, said second annular spring contact having at least portions within said regions in which said electromagnetic waves are confined, said contact rod being positioned so as to fix the position of said device package with respect to the longitudinal axis of said device package.

6. The combination of claim 5 wherein:
said device package has a substantially cylindrical body portion and where said first and second contacts are substantially cylindrical in shape and axially aligned with one another and said body portion.

7. The combination of claim 6 wherein:
said second contact is of lesser diameter than said body portion.

8. The combination of claim 7 wherein:
said first annular spring contact is in electrical contact with at least one conductive wall of said waveguide.

9. The combination of claim 8 further comprising:

spring means for applying a longitudinal force upon said device package in the direction of said second annular contact.

10. A microwave assembly having a mount for a diode or other device within a section of waveguide comprising in combination:

a section of waveguide having four conductive walls forming a substantially rectangular cross-section for confining electromagnetic waves;

a contact rod, one end of said contact rod extending partially through a first aperture in a first conductive wall of said waveguide, said end of said contact rod extending through said first aperture having hollow center portions and being fashioned to form a first annular spring;

a second annular spring, said second annular spring being positioned in a second aperture in the conductive wall of said waveguide opposite said conductive wall in which said first aperture is located, said second annular spring being adapted for applying inwardly directed radial pressure upon a device positioned within said mount, the region of application of said pressure being outside the region in which said electromagnetic waves are confined, said second annular spring being formed of a conductive material, and said second annular spring being in electrical contact with said conductive wall in which said second aperture is located;

a spring for applying longitudinal force to said device, said spring for applying longitudinal force to said device being positioned adjacent said second annular spring on the side of said second annular spring opposite said contact rod, and said longitudinal force being in the direction of said contact rod; and an end cap, said end cap enclosing said spring for applying longitudinal force to said device, said end cap being removable coupled to said conductive wall of said waveguide in which said second aperture is located.

11. The combination of claim 10 further comprising:
a waveguide choke section, said choke section being positioned adjacent said first aperture in said waveguide and said contact rod extending through at least portions of said choke section.

12. The combination of claim 10 wherein:
said end cap has a screw thread on one end thereof; and further comprising:
a socket block coupled to said waveguide, said socket block being adapted for operatively receiving the threaded end of said end cap.

* * * * *